US008669696B1

(12) United States Patent
Guo et al.

(10) Patent No.: US 8,669,696 B1

(45) Date of Patent: Mar. 11, 2014

(54) FIELD EMISSION ELECTRON SOURCE ARRAY AND FIELD EMISSION DEVICE

(71) Applicants: Tsinghua University, Beijing (CN); Hon Hai Precision Industry Co., Ltd., New Taipei (TW)

(72) Inventors: Cai-Lin Guo, Beijing (CN); Jie Tang, Beijing (CN); Peng Liu, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/718,631

(22) Filed: Dec. 18, 2012

(30) Foreign Application Priority Data

Oct. 10, 2012 (CN) .......................... 2012 1 0381735

(51) Int. Cl.
*H01L 29/38* (2006.01)

(52) U.S. Cl.
USPC .......................... 313/346 R; 445/50; 313/309

(58) Field of Classification Search
USPC ..................... 445/50; 313/495–498, 309–310
See application file for complete search history.

(56) References Cited

U.S. PATENT DOCUMENTS

| | | | | |
|---|---|---|---|---|
| 7,781,950 | B2 * | 8/2010 | Liu et al. | 313/311 |
| 7,973,464 | B2 * | 7/2011 | Liu et al. | 313/495 |
| 2007/0170414 | A1 * | 7/2007 | Takai et al. | 257/9 |
| 2010/0221536 | A1 * | 9/2010 | Yang et al. | 428/367 |

* cited by examiner

*Primary Examiner* — Tracie Y Green

(74) *Attorney, Agent, or Firm* — Altis Law Group, Inc.

(57) ABSTRACT

A field emission electron source array includes a number of field emission electron sources aligned side by side. Each field emission electron source includes a linear carbon nanotube structure, an insulating layer and a conductive ring. The linear carbon nanotube structure has a first end and a second end. The insulating layer is coated on an outer surface of the linear carbon nanotube structure. The first conductive ring includes a first ring face and a second ring face, and the first ring face is coplanar with an end surface of the first end of the linear carbon nanotube structure.

20 Claims, 12 Drawing Sheets

FIELD EMISSION ELECTRON SOURCE ARRAY AND FIELD EMISSION DEVICE

RELATED APPLICATIONS

This application claims all benefits accruing under 35 U.S.C. §119 from China Patent Application No. 201210381735.4, filed on Oct. 10, 2012 in the China Intellectual Property Office, the contents of which are hereby incorporated by reference. This application is related to applications entitled, "FIELD EMISSION ELECTRON SOURCE AND FIELD EMISSION DEVICE," filed Dec. 18, 2012 Ser. No. 13/718,587; "METHOD FOR MAKING FIELD EMISSION ELECTRON SOURCE ARRAY," filed Dec. 18, 2012 Ser. No. 13/718,609; "METHOD FOR MAKING FIELD EMISSION ELECTRON SOURCE," filed Dec. 18, 2012 Ser. No. 13/718,626.

BACKGROUND

1. Technical Field

The present disclosure relates to a field emission electron source, a filed emission device, and a method for making the same.

2. Description of Related Art

Field emission displays (FEDs) are a new, rapidly developing flat panel display technology. Generally, FEDs can be roughly classified into diode and triode structures. In particular, carbon nanotube-based FEDs have attracted much attention in recent years.

Field emission electron sources are important elements in FEDs. A method for making field emission electron source usually includes the steps of: providing an insulating substrate; forming a cathode electrode on the substrate; forming a dielectric layer on the cathode electrode; and depositing a plurality of carbon nanotubes on the exposed cathode electrode as the electron emitter. However, the carbon nanotubes fabricated by the CVD method are not secured on the cathode electrode. The carbon nanotubes are prone to be pulled out from the cathode electrode by a strong electric field force, thus causing the field emission electron source to have a short lifespan.

What is needed, therefore, is a field emission electron source that can overcome the above-described shortcomings and a method for making the same.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
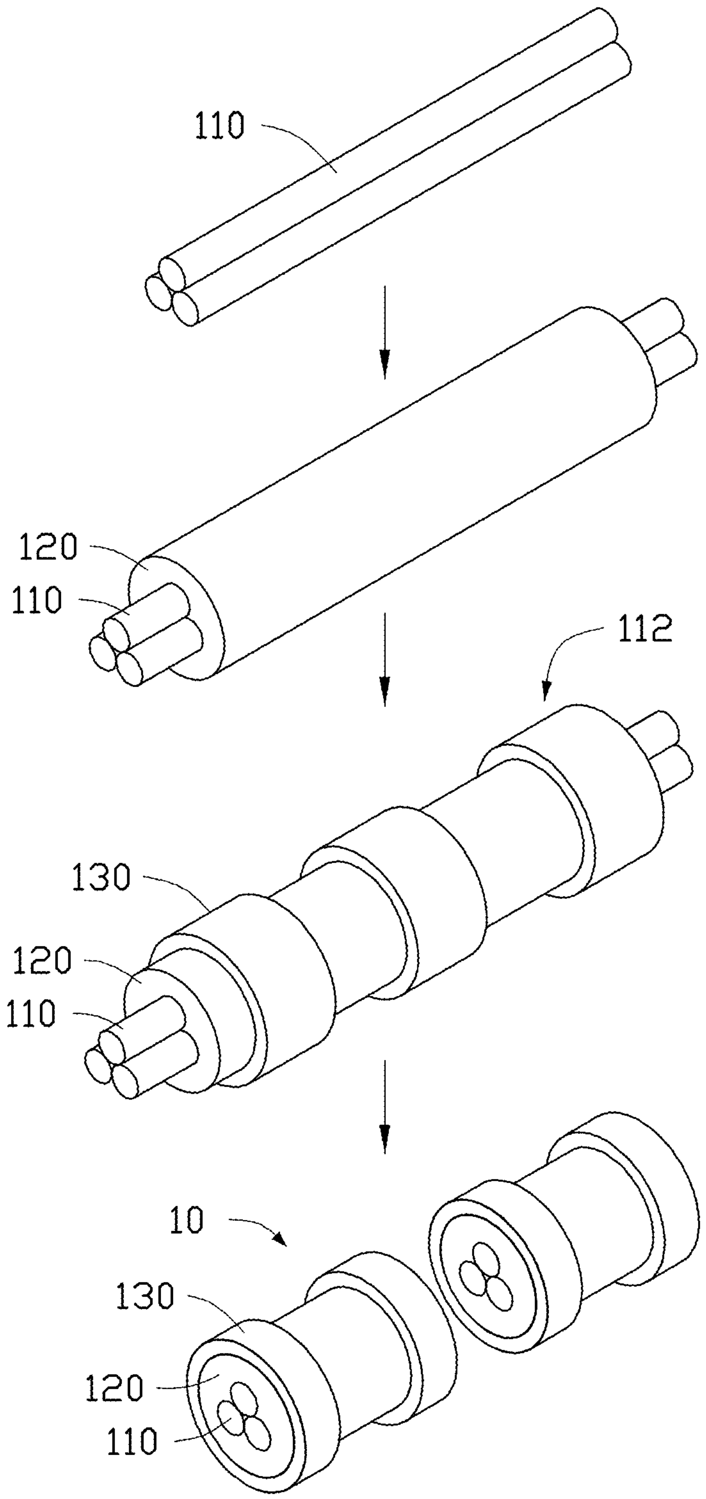
FIG. 1 is a flowchart of one embodiment of a method for making a field emission electron source.

Referring to FIG. 1, a method of one embodiment for making a field emission electron source 10 includes the following steps:

(S10) providing a linear carbon nanotube structure 110;

(S11) coating an insulating layer 120 on outer surface of the linear carbon nanotube structure 110;

(S12) forming a field emission electron source preform 112 by applying a plurality of conductive rings 130 on outer surface of the insulating layer 120; and (S13) cutting the field emission electron source preform 112 through the plurality of conductive rings 130.

In step (S10), the linear carbon nanotube structure 110 is a flexible and freestanding structure able to emit electrons. The term "freestanding structure" means that the linear carbon nanotube structure 110 can sustain the weight of itself when it is hoisted by a portion thereof without any significant damage to its structural integrity. Thus, the linear carbon nanotube structure 110 can be suspended by two spaced supports. The linear carbon nanotube structure 110 is a linear structure, such as a single carbon nanotube, a carbon nanotube wire, a carbon nanotube composite wire or any combination thereof. The single carbon nanotube can be a single-walled carbon nanotube or multi-walled carbon nanotube. The carbon nanotube wire can be composed of a plurality carbon nanotubes in parallel with each other or twisted with each other. The carbon nanotube composite wire can be a carbon nanotube composited with a silicon wire, such as the carbon nanotube wire and the silicon wire parallel with each other or twisted with each other. The carbon nanotube composite wire can also be a carbon nanotube wire composited with organic material or inorganic material. In one embodiment, the linear carbon nanotube structure 110 is composed of a plurality of carbon nanotubes.

The linear carbon nanotube structure 110 can also include a support wire to improve the mechanical strength thereof. The support wire can be metallic wire such as iron wire, copper wire, aluminum wire, silver wire, or golden wire. The support wire can also be a nonmetallic wire. The diameter and length of the support wire can be selected according to the linear carbon nanotube structure 110. The diameter of the support wire can range from about 50 micrometers to about 500 micrometers.

The diameter of the linear carbon nanotube structure 110 ranges from about 0.01 micrometers to about 600 micrometers. In one embodiment, the diameter of the linear carbon nanotube structure 110 ranges from about 0.5 micrometers to about 10 micrometers.

In one embodiment, the linear carbon nanotube structure 110 is composed of a plurality of carbon nanotube wires, and the diameter of the linear carbon nanotube structure 110 ranges from about 0.03 micrometers to about 10 micrometers. Each carbon nanotube wire can be a freestanding structure. The plurality of carbon nanotube wires can be parallel with each other or twisted with each other to form a cable. In one embodiment, the linear carbon nanotube structure 110 is composed of three carbon nanotube wires, and the diameter of the linear carbon nanotube structure 110 is about 0.05 micrometers.

Figure 2:
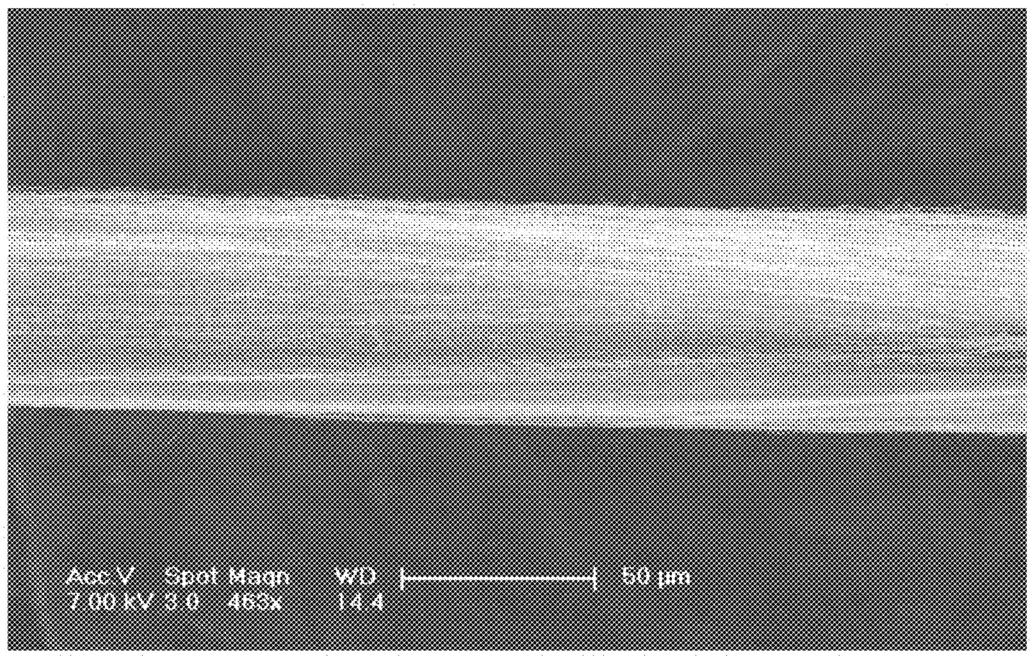
FIG. 2 shows a scanning electron microscope (SEM) image of one embodiment of an untwisted carbon nanotube wire.
Figure 3:
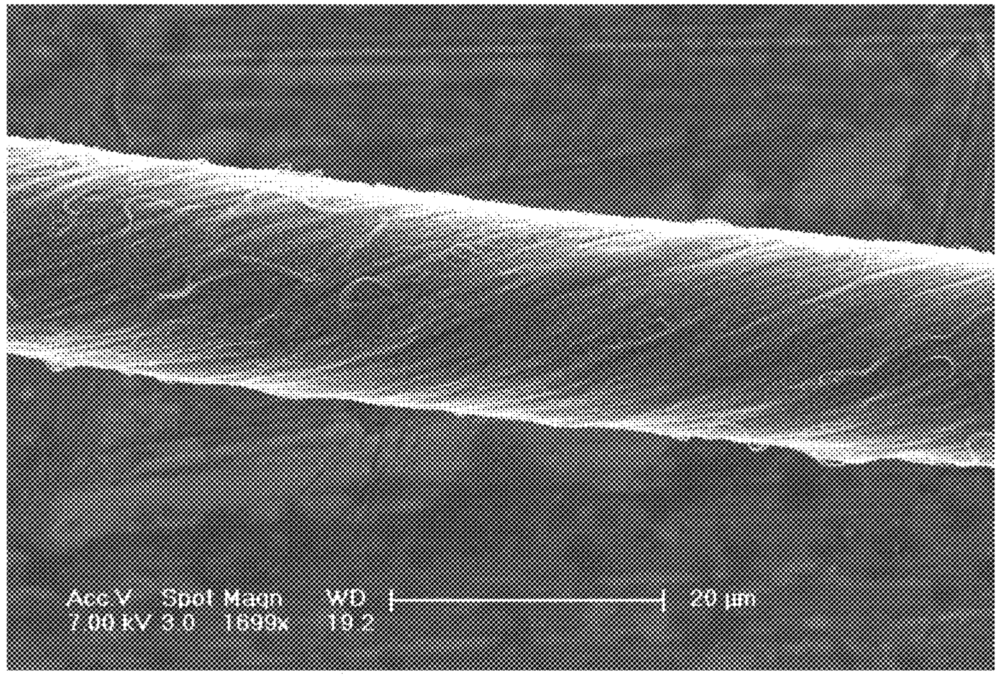
FIG. 3 shows a SEM image of one embodiment of a twisted carbon nanotube wire.

Also referring to FIG. 2 and FIG. 3, the carbon nanotube wire can be a twisted carbon nanotube wire or untwisted carbon nanotube wire. The untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity and shape. Length of the untwisted carbon nanotube wire can be arbitrarily set as desired. A diameter of the untwisted carbon nanotube wire ranges from about 0.5 nm to about 100 μm.

The twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm.

The carbon nanotube wire can be made by following steps:

(S101) providing a carbon nanotube array;

(S102) pulling out a carbon nanotube film from the carbon nanotube array by using a tool; and (S103) forming a carbon nanotube wire by mechanically treating the carbon nanotube film.

In step (S101), a given carbon nanotube array can be formed by the following substeps: (S1011) providing a substantially flat and smooth substrate; (S1012) forming a catalyst layer on the substrate; (S1013) annealing the substrate with the catalyst layer in air at a temperature ranging from about 700° C. to about 900° C. for about 30 to 90 minutes; (S1014) heating the substrate with the catalyst layer to a temperature ranging from about 500° C. to about 740° C. in a furnace with a protective gas therein; and (S1015) supplying a carbon source gas to the furnace for about 5 to 30 minutes and growing the carbon nanotube array on the substrate.

In step (S1011), the substrate can be a P-type silicon wafer, an N-type silicon wafer, or a silicon wafer with a film of silicon dioxide thereon. In the present embodiment, a 4-inch P-type silicon wafer is used as the substrate.

In step (S1012), the catalyst can be made of iron (Fe), cobalt (Co), nickel (Ni), or any alloy thereof.

In step (S1014), the protective gas can be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The carbon nanotube array formed under the above conditions is essentially free of impurities such as carbonaceous or residual catalyst particles. The carbon nanotubes in the carbon nanotube array are closely packed together by van der Waals attractive force.

In step (S102), the carbon nanotube film can be formed with a tool (e.g., adhesive tape, pliers, tweezers, or another tool allowing multiple carbon nanotubes to be gripped and pulled simultaneously) by the following substeps: (S1021) selecting one or more carbon nanotubes having a predetermined width from the array of carbon nanotubes; and (S1022) pulling the carbon nanotubes to form carbon nanotube segments that are joined end to end at an uniform speed to achieve a uniform carbon nanotube film.

In step (S1021), the carbon nanotube segments can be selected by using an adhesive tape such as the tool to contact the carbon nanotube array. Each carbon nanotube segment includes a plurality of carbon nanotubes parallel to each other.

More specifically, during the pulling process, as the initial carbon nanotube segments are drawn out, other carbon nanotube segments are also drawn out end-to-end due to the van der Waals attractive force between ends of adjacent segments. This process of drawing ensures that a continuous, uniform carbon nanotube film having a predetermined width can be formed. The carbon nanotube film (also known as a yarn, a ribbon, a yarn string among other terms used to define the structure) includes a plurality of carbon nanotubes joined end-to-end. The carbon nanotubes in the carbon nanotube film are all substantially parallel to the pulling/drawing direction of the carbon nanotube film, and the carbon nanotube film produced in such manner can be selectively formed to have a predetermined width. The carbon nanotube film formed by the pulling/drawing method has superior uniformity of thickness and superior uniformity of conductivity over a typically disordered carbon nanotube film. Furthermore, the pulling/drawing method is simple, fast, and suitable for industrial applications.

The width of the carbon nanotube film depends on a size of the carbon nanotube array. The length of the carbon nanotube film can be arbitrarily set as desired. When the substrate is a 4-inch P-type silicon wafer, as in the present embodiment, the width of the carbon nanotube film ranges from about 0.01 centimeters to about 10 centimeters, the length of the carbon nanotube film can be above 100 meters, and the thickness of the carbon nanotube film ranges from about 0.5 nanometers to about 100 microns.

In step (S103), the carbon nanotube film can be treated with organic solvent to form the untwisted carbon nanotube wire, or twisted to form the twisted carbon nanotube wire, or cut to form the untwisted carbon nanotube wire. The twisted carbon nanotube wire can be twisted by following steps: (S1031), fixing the tool attached with one end of the carbon nanotube film to a rotating machine; (S1032), twisting the carbon nanotube film to form the twisted carbon nanotube wire.

In step (S11), the insulating layer 120 can be coated on the outer surface of the linear carbon nanotube structure 110 via coating, vacuum evaporation, electron sintering, or ion sintering. The insulating layer 120 is a continuous structure and can be directly coated on the outer surface of the linear carbon nanotube structure 110. The thickness of the insulating layer 120 ranges from about 1 micrometer to about 100 micrometers. In one embodiment, the thickness of the insulating layer 120 is about 3 micrometers. The cross-section of the linear carbon nanotube structure 110 coated with insulating layer 120 can be circular, triangular, rectangular or square. The insulating layer 120 can be firmly attached on the outer surface of the linear carbon nanotube structure 110 via van der Waals force. Furthermore, because the linear carbon nanotube structure 110 includes a plurality of gaps, the portions of the insulating layer 120 can be embedded into the plurality of gaps.

The material of insulating layer 120 can be aluminum oxide, electrovacuum ceramics, polytetrafluoroethylene, or nano-clay-polymer composite material. In one embodiment, the material of the insulating layer 120 is electrovacuum ceramics.

It can also be understood that, the insulating layer 120 can also be a discontinuous structure, and the insulating layer 120 can be a plurality of insulating segments coated on the outer surface of the linear carbon nanotube structure 110.

In one embodiment, the method of coating the insulating layer 120 on the outer surface of the linear carbon nanotube structure 110 includes the following steps:

(S111) coating an insulating material on the outer surface of the linear carbon nanotube structure 110; and (S112) forming the insulating layer 120 by sintering the insulating material.

In step (S112), the air in the insulating material will be exhausted, and the combination between the insulating layer 120 and the linear carbon nanotube structure 110 will be improved.

In step (S12), the plurality of conductive rings 130 can be applied on the outer surface of the insulating layer 120 via physical vapor deposition via a mask layer (not shown) to form the field emission electron source preform 112. The plurality of conductive rings 130 is around the outer surface of the insulating layer 120 and spaced from each other along the axis of the linear carbon nanotube structure 110. The two adjacent conductive rings 130 are spaced from each other. In one embodiment, the plurality of conductive rings 130 is spaced from each other by a certain interval. The interval between adjacent two of the conductive rings 130 ranges from about 4 micrometers to about 20 micrometers, such as 6 micrometers, 10 micrometers, or 15 micrometers. Each conductive ring 130 surrounds the linear carbon nanotube structure 110, and the inner surface of the conductive ring 130 is directly attached on the outer surface of the insulating layer 120. Thus, the outer diameter of the linear carbon nanotube structure 110 is equal to the inner diameter of the conductive ring 130. The conductive ring 130 can be a closed ring, or semi-closed ring with a notch on the ring. The conductive ring 130 includes a first ring face 1301 and a second ring face 1303 opposite to the first ring face 1301. The first ring face 1301 and the second ring face 1303 are perpendicular with the axis of linear carbon nanotube structure 110, or with an angle with the axis of the linear carbon nanotube structure 110.

The width of the conductive ring 130 ranges from about 1 micrometer to about 20 micrometer. The width of the conductive ring 130 is defined as the distance between the first ring face 1301 and the second ring face 1303 along the central axis of the conductive ring 130. The thickness of the conductive ring 130 ranges from about 1 micrometer to about 10 micrometers. The material of the conductive ring 130 can be gold, silver, copper, or other metal. In one embodiment, the first ring face 1301 and the second ring face 1303 of the conductive ring 130 are perpendicular with the central axis of the conductive ring, the width of the conductive ring 130 is about 4 micrometers, and the thickness of the conductive ring 130 is about 2 micrometers. Furthermore, the diameter of the particles, that make up the of the material of the conductive ring 130, are nanometers in scale. In one embodiment, the diameter of the particle is smaller than 100 nanometers, thus the air cannot be existed in the conductive ring 130.

In step (S13), the field emission electron source preform 112 can be cut by following steps:

(S131) fixing the opposite two ends of the field emission electron source preform 112;

(S132) forming a plurality of field emission electron sources 10 by cutting the field emission electron source preform 112 through the plurality of conductive rings 130.

In step (S132), the field emission electron source preform 112 is cut via a chemical method or physical method such as mechanical machine or laser. Furthermore, the field emission electron source preform 112 can be cut by any manner, ensuring that at least one end of the field emission electron source 10 including one conductive ring 130 located on the outer surface of the insulating layer 120. The field emission electron source preform 112 can be cut from the outer surface of the conductive ring 130 between the first ring face 1301 and the second ring face 1303. The field emission electron source preform 112 can also be cut along the first ring face 1301 or the second ring face 1303. An angle α can be formed between a cutting direction and the axis of the linear carbon nanotube structure 110, $0° < \alpha \leq 90°$. In one embodiment, the field emission electron surface preform 112 is cut along a direction perpendicular with the axis of the linear carbon nanotube structure 110. An end surface can be formed on the end of the field emission electron source 10. The end surface can be a planar surface. The angle α existed between the end surface and the axis of the field emission electron source 10. In one embodiment, the α is equal to 90 degrees, thus the end surface of the field emission electron source 10 is perpendicular with the axis of the field emission electron source 10. The linear carbon nanotube structure 110 is exposed through the end surface and is the electron emitter. In each field emission electron source 10, the end surface of the linear carbon nanotube structure 110, the end surface of the insulating layer 120, and the first ring face 1301 of the conductive ring 130 are coplanar.

Figure 4:
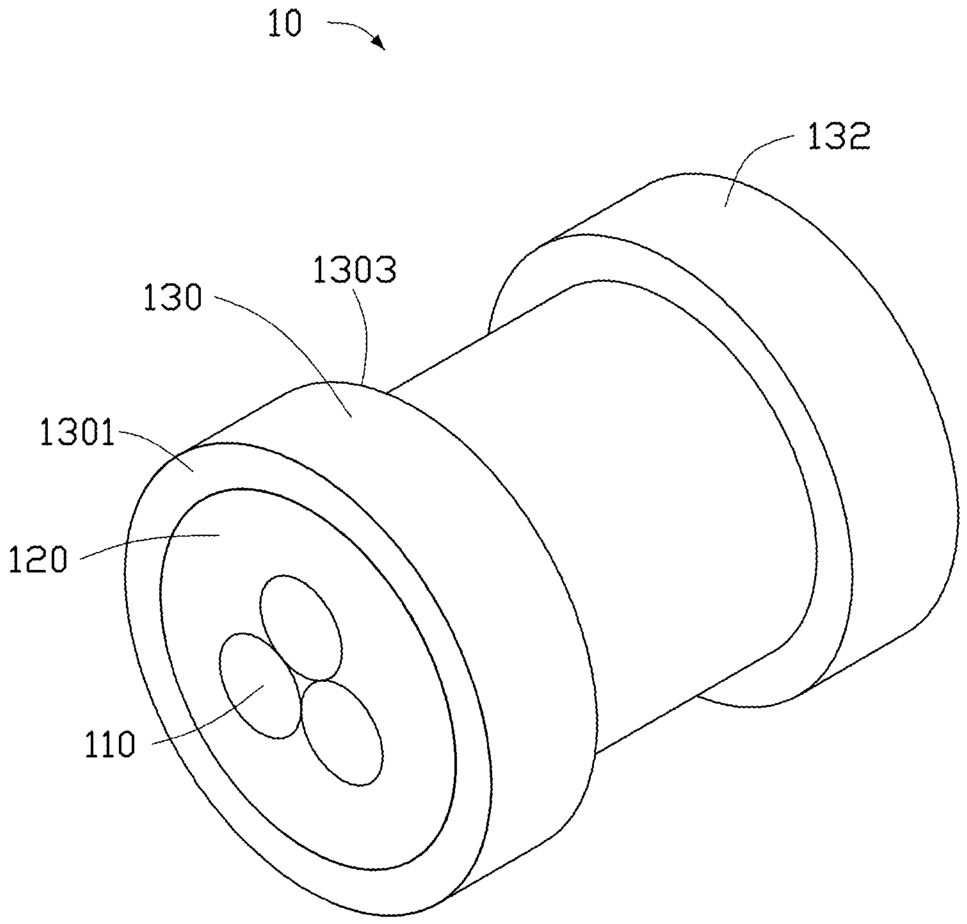
FIG. 4 is a schematic view of one embodiment of a field emission electron source.

Referring to FIG. 4, a field emission electron source 10 of one embodiment includes a linear carbon nanotube structure 110, an insulating layer 120 coated on outer surface of the linear carbon nanotube structure 110, and a first conductive ring 130 coated on the outer surface of the insulating layer 120 and located on one end of the linear carbon nanotube structure 110. The linear carbon nanotube structure 110, and the first conductive ring 130 are coaxial. Two opposite end surfaces of linear carbon nanotube structure 110 are exposed from the insulating layer 120.

The insulating layer 120 is coated on the outer surface of the linear carbon nanotube structure 110. The linear carbon nanotube structure 110 includes a first end and a second end opposite to the first end. The first conductive ring 130 includes a first ring face 1301 and a second ring face 1303, opposite to the first ring face 1301. The first ring face 1301 is adjacent to the first end of the linear carbon nanotube structure 110 and coplanar with the first end surface of linear carbon nanotube structure 110. The first ring face 1301, the second ring face 1303, and the linear carbon nanotube structure 110 are coaxial.

The first conductive ring 130 on the second end of the linear carbon nanotube structure 110 can be electrically connected to an anode electrode. The first conductive ring 130 on the first end of the linear carbon nanotube structure 110 can be fixed to a cathode electrode (not shown) in the field emission. Thus, the end surface of the linear carbon nanotube structure 110 can be fixed and electrically connected to the cathode electrode, and gaps between the end surface of the linear carbon nanotube structure 110 and the cathode electrode can be avoided. Therefore, the heat produced by the gaps can be reduced or avoided. The lifespan of the field emission electron source 10 can be prolonged.

While applying a voltage to the field emission electron source 10 between the first conductive ring 130 and the linear carbon nanotube structure 110, and the electrons can be emitted from the end surface of the linear carbon nanotube structure 110 exposed from the insulating layer 120. In one embodiment, the applied voltage only ranges from about 3 V to about 6 V, the electric field strength will be raised to about 1 V/um to about 2 V/um, and the linear carbon nanotube structure 110 can emit electrons. Thus, the driven voltage will be decreased, and electrical break down can be avoided.

The field emission electron source and the method for making thereof have following advantages. First, the linear carbon nanotube structure is directly and firmly fixed into the insulating layer, and the linear carbon nanotube structure will not be easily pulled out by the electric field. Second, the field emission electron source is freestanding and used as an independent field emission unit, thus it is convenient to be assembled, replaced, and integrated with other elements. Third, the method of making field emission electron source is very simple to fix the linear carbon nanotube structure into the insulating layer, and the electric field applied to the field emission electron source can be easily controlled by controlling the thickness of the insulating layer. Fourth, the method of making field emission electron source can obtain a plurality of field emission electron sources at the same time, the process is simple, the cost is low and efficiency is high.

Figure 5:
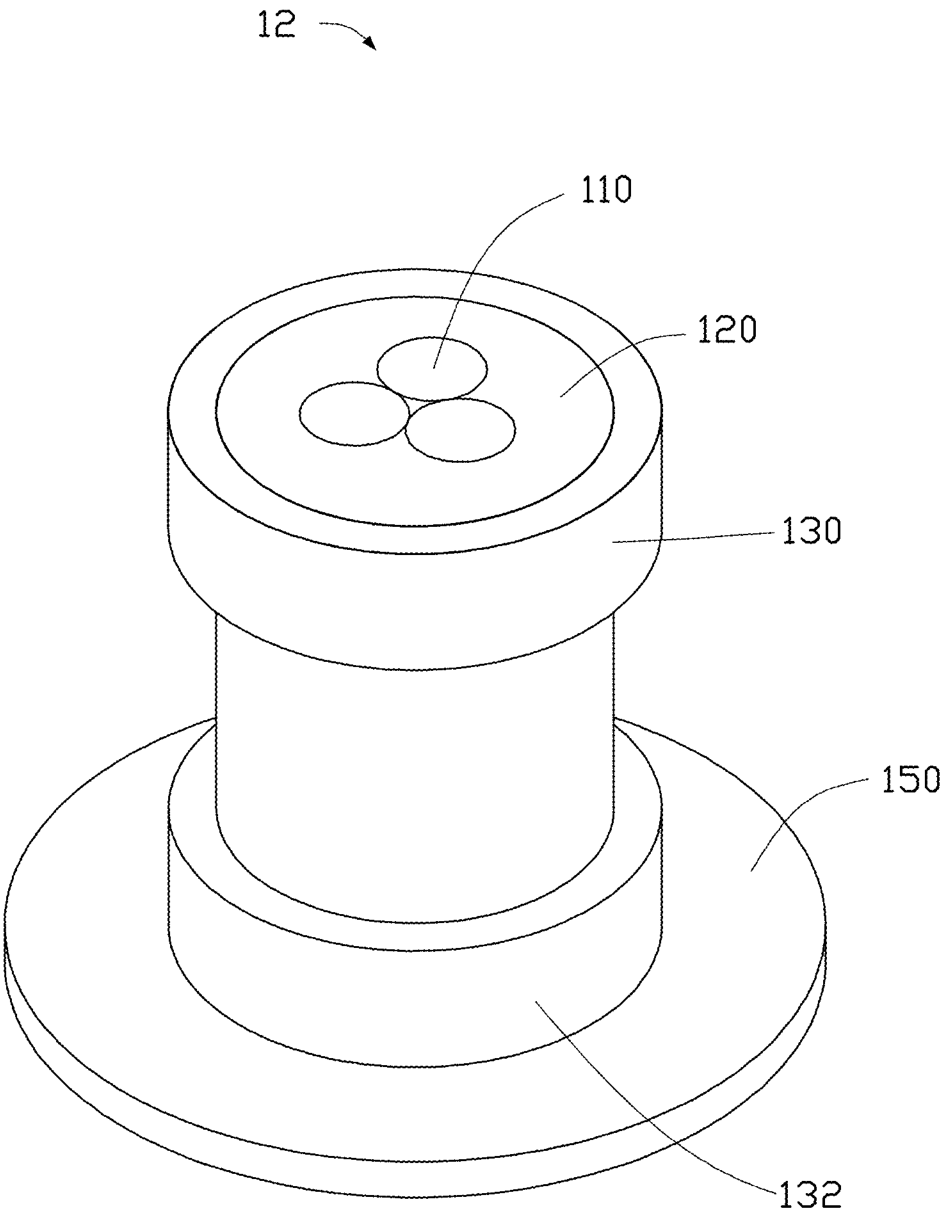
FIG. 5 is a schematic view of one embodiment of a field emission device.

Also referring to FIG. 5, a field emission device 12 includes a cathode electrode 150 and a field emission electron source 10. The field emission electron source 10 includes a first end and a second end opposite to the first end. The first end is electrically connected to the cathode electrode 150, and the second end extends away from the cathode electrode 150. The field emission electron source 10 includes a linear carbon nanotube structure 110, an insulating layer 120 coated on the outer surface of the linear carbon nanotube structure 110, and a first conductive ring 130. The linear carbon nanotube structure 110 includes a first end and a second end opposite to the first end. The second end is fixed and electrically connected to the cathode electrode 150, and the first end extends away from the cathode electrode 150. The first conductive ring 130 is coated on the outer surface of the insulating layer 120 on the first end of the linear carbon nanotube structure 110. The first conductive ring 130 is configured as a gate electrode of the field emission device 12.

The end surface on the second end of the linear carbon nanotube structure 110 is exposed from the insulating layer 120 and electrically connected to the cathode electrode 150. The first conductive ring 130 is isolated from the linear carbon nanotube structure 110 via the insulating layer 120. While applying a voltage between the first conductive ring 130 and the cathode electrode 150, a driven voltage will be applied between the first conductive ring 130 and the end surface of the linear carbon nanotube structure 110. The electrons will be emitted from the end surface of the linear carbon nanotube structure 110 under the driven voltage. The material of the cathode electrode 150 can be selected according to need, to ensure that the linear carbon nanotube structure 110 is electrically connected to the cathode electrode 150.

Furthermore, a second conductive ring 132 can also be coated on the outer surface of the insulating layer 120 and located on the second end of the linear carbon nanotube structure 110. The second conductive ring 132 is spaced from the first conductive ring 130. The second conductive ring 132 can be fixed to the cathode electrode 150 such that the linear carbon nanotube structure 110 will be fixed and electrically connected to the cathode electrode 150.

Figure 6:
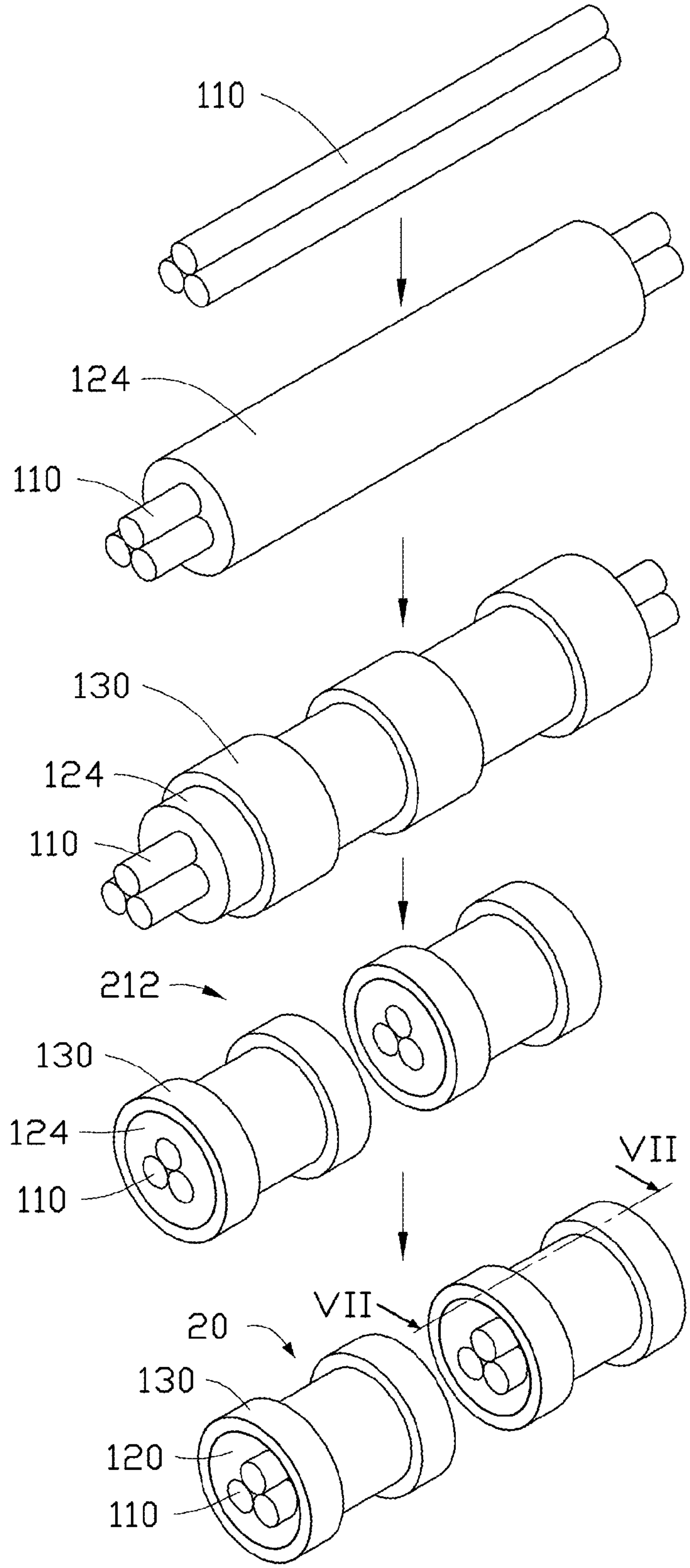
FIG. 6 is a flowchart of one embodiment of a method for making a field emission electron source.

Referring to FIG. 6, one embodiment of a method for making a field emission electron source 20 includes the following steps:

(S20) providing a linear carbon nanotube structure 110;

(S21) coating an insulating material 124 on outer surface of the linear carbon nanotube structure 110;

(S22) applying a plurality of conductive rings 130 on outer surface of the insulating material 124 to form a first field emission electron source preform, wherein the plurality of conductive rings 130 are spaced from each other;

(S23) forming a plurality of second field emission electron source preforms 212 by cutting the first field emission electron source preform from the plurality of conductive rings 130; and (S24) sintering the plurality of second field emission electron source preforms 212.

The method of making a field emission electron source 20 is similar to the method of making field emission electron source 10, except that a step of sintering the plurality of second field emission electron source preforms 212 is performed.

In step (S24), an insulating layer 120 will be formed by the insulating material 124. The insulating material 124 can be selected according to need. The material of insulating material 124 can be aluminum oxide, electrovacuum ceramics, polytetrafluoroethylene, or nano-clay-polymer composite material. In one embodiment, the cross section of the insulating material 124 will be depressed during the sintering process, a recess 1202 will be formed at the two opposite ends of the field emission electron source 20, and the two opposite ends of the linear carbon nanotube structure 110 will be located in the recess 1202 and extend out of the insulating layer 120. The depth of the recess 1202 is smaller than the width of the conductive ring 130. The length of the linear carbon nanotube structure 110 extending out of the insulating layer 120 depends on the shrinkage rate of the insulating material 124. After the insulating material 124 is sintered, the two opposite end surfaces of the linear carbon nanotube structure 110 will be coplanar with the first ring face 1301 of the conductive ring 130.

Figure 7:
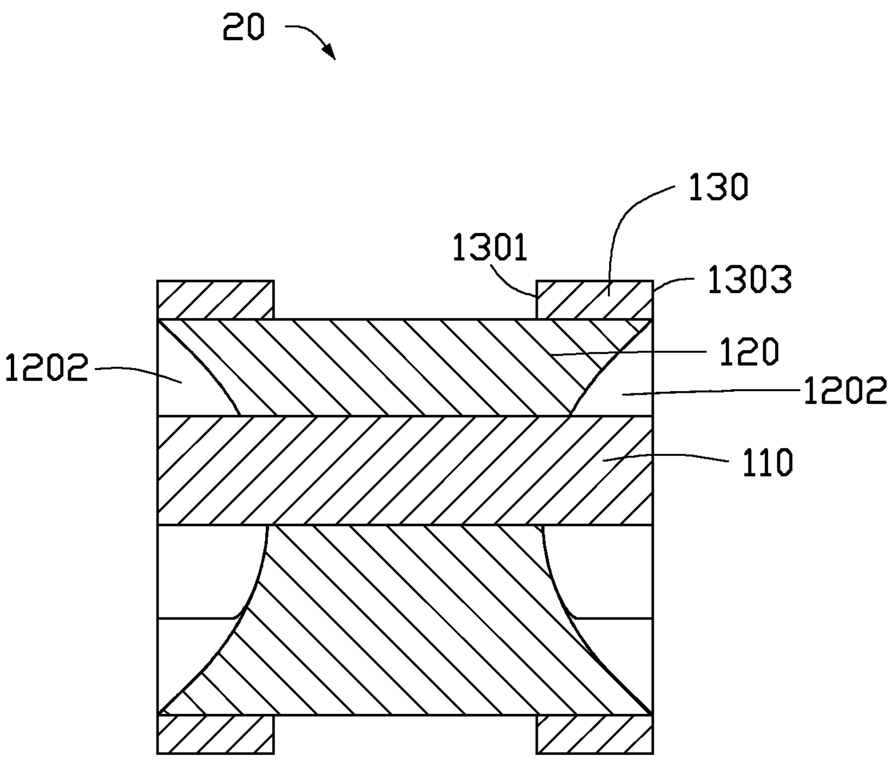
FIG. 7 is a schematic, cross-sectional view, along a line VII-VII of FIG. 6.

Also referring to FIG. 7, a field emission electron source 20 includes a linear carbon nanotube structure 110, an insulating layer 120 coated on outer surface of the linear carbon nanotube structure 110, and a conductive ring 130 is coated on outer surface of the insulating layer 120 and on one end of the linear carbon nanotube structure 110. The linear carbon nanotube structure 110 is coaxial with the conductive ring 130. The two opposite end surfaces of the linear carbon nanotube structure 110 extend out of the insulating layer 120.

The field emission electron source 20 is similar to field emission electron source 10, except that a recess 1202 is formed in the insulating layer 120 and the end surfaces of the linear carbon nanotube structure 110 extend out of the insulating layer 120. The length of the linear carbon nanotube structure 110 extending out of the insulating layer 120 is shorter than the width of the conductive ring 130. The first ring face 1301 of the conductive ring adjacent to the end surface of the linear carbon nanotube structure 110 is coplanar with the end surface of the linear carbon nanotube structure 110.

Figure 8:
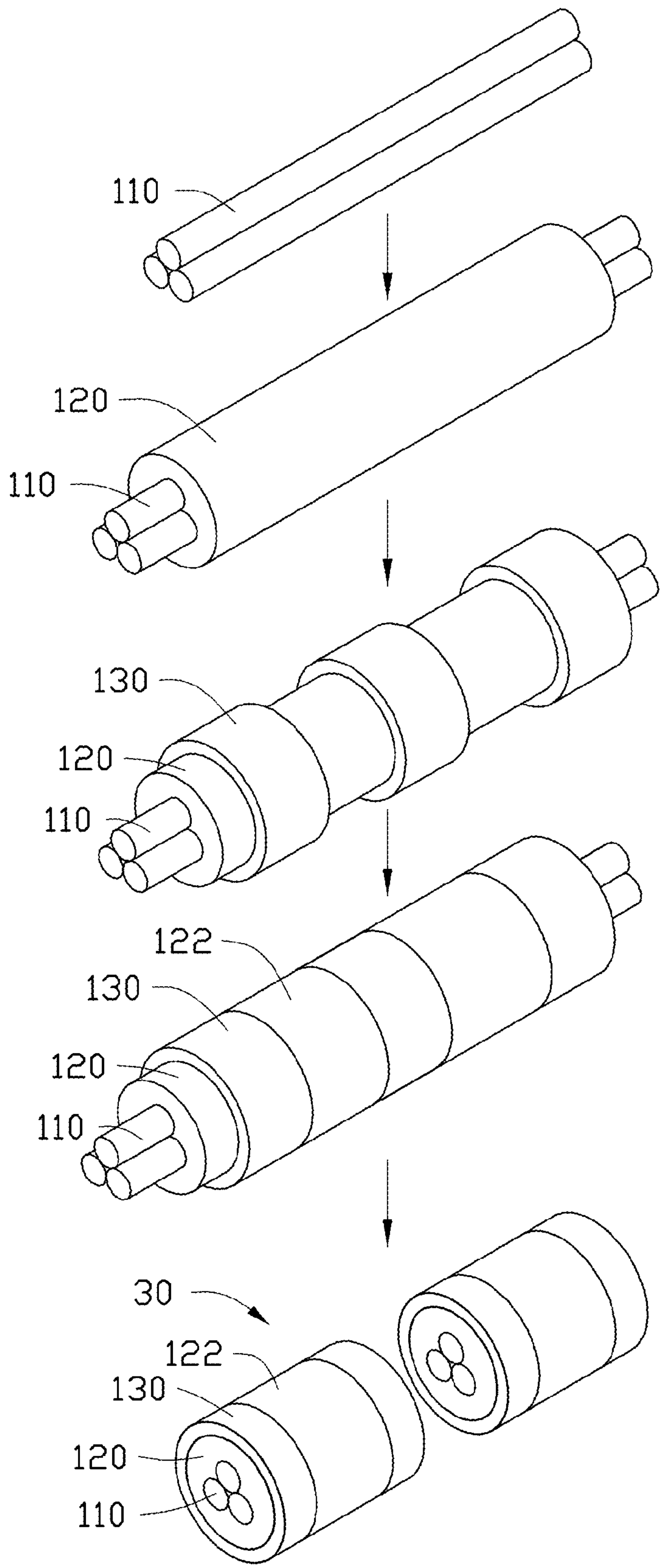
FIG. 8 is a flowchart of one embodiment of a method for making a field emission electron source.

Referring to FIG. 8, one embodiment of a method for making a field emission electron source 30 includes the following steps:

(S30) providing a linear carbon nanotube structure 110;

(S31) coating an insulating layer 120 on outer surface of the linear carbon nanotube structure 110;

(S32) applying a plurality of conductive rings 130 on outer surface of the insulating layer 120, wherein the plurality of conductive rings 130 are spaced from each other to expose a plurality of outer surfaces of the insulating layer 120;

(S33) coating an insulating ring 122 on the exposed outer surface of the insulating layer 120 between adjacent two of the conductive rings 130 to form a field emission electron source preform; and (S34) cutting the field emission electron source preform through the plurality of conductive rings 130.

The method of making field emission electron source 30 is similar to the method of the field emission electron source 10, except that a step of coating the insulating ring 122 on the outer surface of the insulating layer 120 between two adjacent conductive rings 130 is performed.

The method of coating the insulating ring 122 is similar to the method of coating the insulating ring 130. The thickness of the insulating ring 122 can be same as the thickness of the conductive ring 130. Thus the outer diameter of the field emission electron source 30 along the axis of the field emission electron source 30 can be same. Furthermore, the insulating ring 122 can be integrated with the insulating layer 120 to form an integrated structure.

Figure 9:
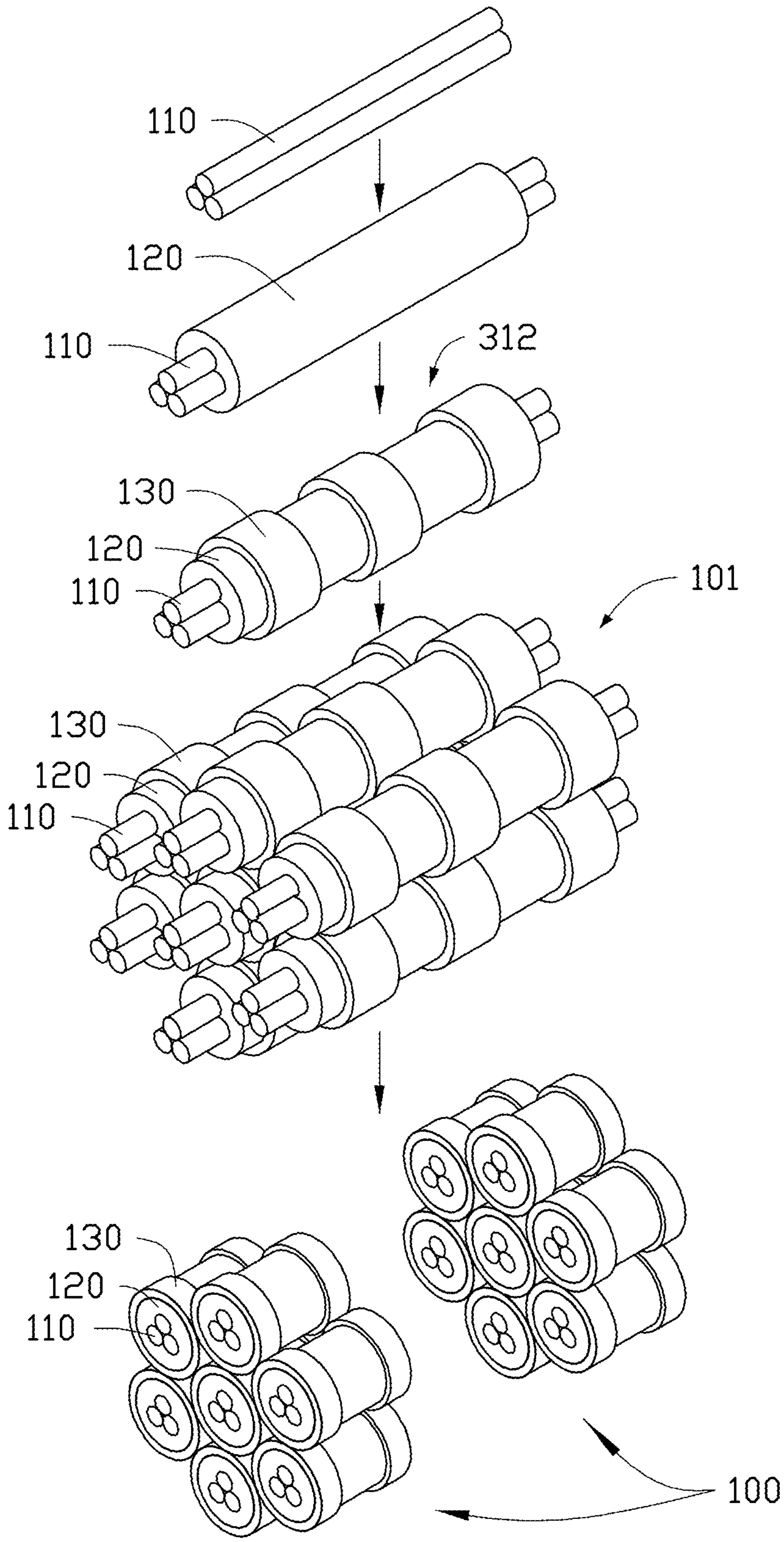
FIG. 9 is a flowchart of one embodiment of a method for making a field emission electron source array.

Referring to FIG. 9, one embodiment of a method for making a field emission electron source array 100 includes the following steps:

(S40) providing a linear carbon nanotube structure 110;

(S41) coating an insulating layer 120 on outer surface of the linear carbon nanotube structure 110;

(S42) forming a field emission electron source preform 312 by coating a plurality of conductive rings 130 on outer surface of the insulating layer 120;

(S43) forming a field emission electron source array preform 101 by aligning a plurality of field emission electron source preforms 312 side by side; and (S44) cutting the field emission electron source array preform 101.

The method of making the field emission electron source array 100 is similar to the method of making the field emission electron source 10, except that a step of aligning the plurality of field emission electron source preforms 312 side by side is performed before cutting.

In step (S43), the term "side by side" includes that the plurality of field emission electron source preforms 312 extends along the same direction defined as an X direction. The plurality of conductive rings 130 having same X coordinate are in contact with each other. The conductive ring 130 in one field emission electron source preform 312 is put into a one-to-one correspondence with the conductive ring 130 in the adjacent field emission electron source preforms 312. Thus the plurality of conductive rings 130 having same X coordinate can be cut off at the same time. The plurality of field emission electron source preforms 312 is closely packed together and will not be separated from each other during the cutting process.

In step (S44), the field emission electron source array preform 101 is cut from the outer surface between the first ring face 1301 and the second ring face 1303 of the conductive ring 130. The cutting direction is substantially perpendicular with that of the axis of the linear carbon nanotube structure 110, to ensure that each field emission electron source 10 of the field emission electron source array 100 can emit electrons in application. After the field emission electron source array preform 101 is cut off, two opposite fracture surfaces of the field emission electron source array 100 are planar. On the fracture surface of the field emission electron source array 100, an end surface of the linear carbon nanotube structure 110, a ring face of the conductive ring 130, and an end surface of the insulating layer 120 are coplanar. Furthermore, the fracture surface of the field emission electron source array 100 can be perpendicular with the axis of the linear carbon nanotube structure 110.

The method of making field emission electron source array 100 has following advantages. First, the method can make a plurality field emission electron source arrays 100 once time, and each field emission electron source array 100 can be used to emit electrons independently. Second, the field emission electron source array 100 has high field emitting current. Third, the field emission electron source array 100 can be distributed to form a pattern to emit electrons, and the field emission electron source array 100 is easy to replace, adjust, and move. Fourth, each of the linear carbon nanotube structures 110 is firmly fixed into the insulating layer 120, thus the linear carbon nanotube structure can endure high driven voltage.

As shown in FIG. 9, the field emission electron source array 100 includes a plurality of field emission electron sources 10 aligned side by side. The plurality of field emission electron sources 10 extends along the same direction. Each field emission electron source 10 includes at least one conductive ring 130. The conductive ring 130 is located on the outer surface of the insulating layer 120 and at one end of the linear carbon nanotube structure 110. The conductive ring 130 includes a first ring face 1301, which is coplanar with the end surface of the linear carbon nanotube structure 110, and a second ring face 1303, that is opposite to the first ring face 1301. The conductive rings 130 at the same ends of the plurality of linear carbon nanotube structures 110 are electrically connected with each other.

Figure 10:
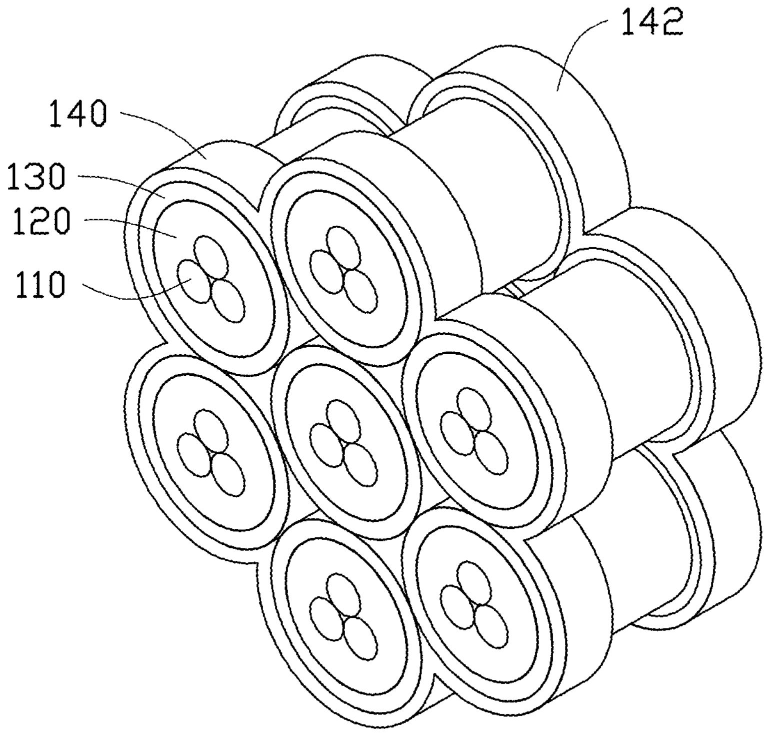
FIG. 10 is schematic view of one embodiment of a field emission electron source array of FIG. 9 coated with a conductive layer.

Referring to FIG. 10, the method of making field emission electron source array 100 can further comprise a step of locating a conductive layer 140 to electrically connect the plurality of conductive rings 130 on the same ends of the field emission electron source array 100. Because the plurality of field emission electron sources 10 are aligned side by side, and portions of the outer surface of the conductive ring 130 will be exposed. The conductive layer 140 is coated on the exposed outer surface of the conductive ring 130. The conductive layer 140 can be a continuous structure. By applying a voltage between the conductive layer 140 and the linear carbon nanotube structure 110, the driven voltage can be applied between each field emission electron source 10.

Figure 11:
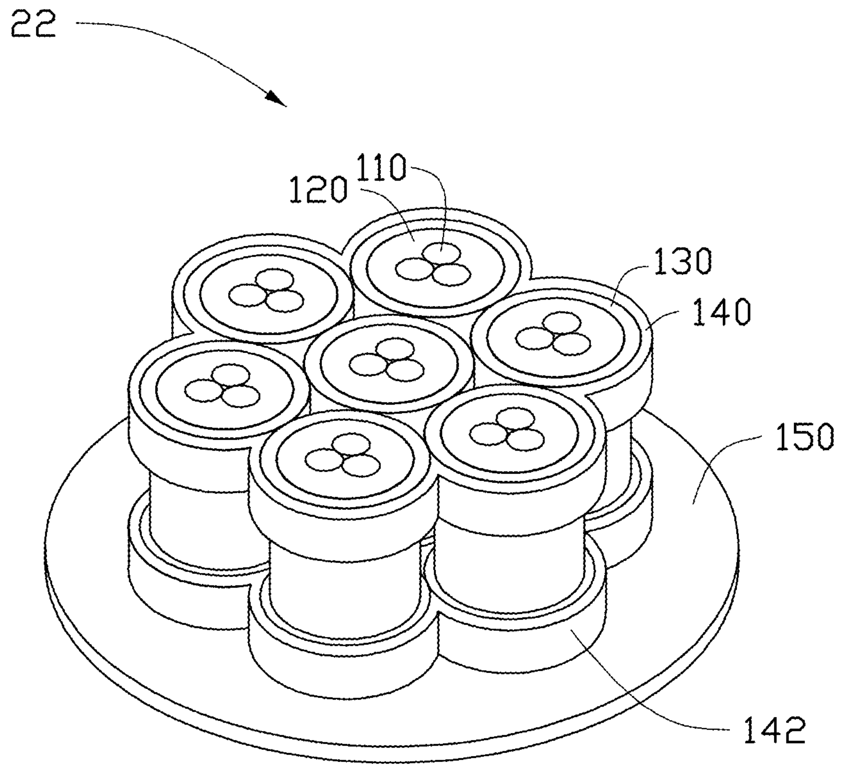
FIG. 11 is a schematic view of one embodiment of a field emission device.

Referring to FIG. 11, one embodiment of a field emission device 22 includes: a cathode electrode 150, and a field emission electron source array 100 electrically connected to the cathode electrode 150. The field emission electron source array 100 includes a first end and a second end opposite to the first end. The first end of the field emission electron source array 100 is fixed and electrically connected to the cathode electrode 150, and the second end of the field emission electron source array 100 extends away from the cathode electrode 150. The field emission electron source array 100 includes a plurality of field emission electron sources 10 aligned side by side. Each field emission electron source 10 includes a linear carbon nanotube structure 110, an insulating layer 120 enclosed on the linear carbon nanotube structure 110, and a conductive ring 130 around the insulating layer 120. The linear carbon nanotube structure 110 includes a first end electrically connected to the cathode electrode 150. The conductive ring 130 is located on the outer surface of the insulating layer 120 and coated on the second end of the linear carbon nanotube structure 110.

The field emission device 22 further includes a conductive layer 140. The plurality of field emission electron sources 10 is aligned side by side, and the conductive rings 130 are electrically connected with each other, and portions of the outer surface of the conductive ring 130 are exposed. The conductive layer 140 is coated on the exposed outer surface of the conductive ring 130.

Figure 12:
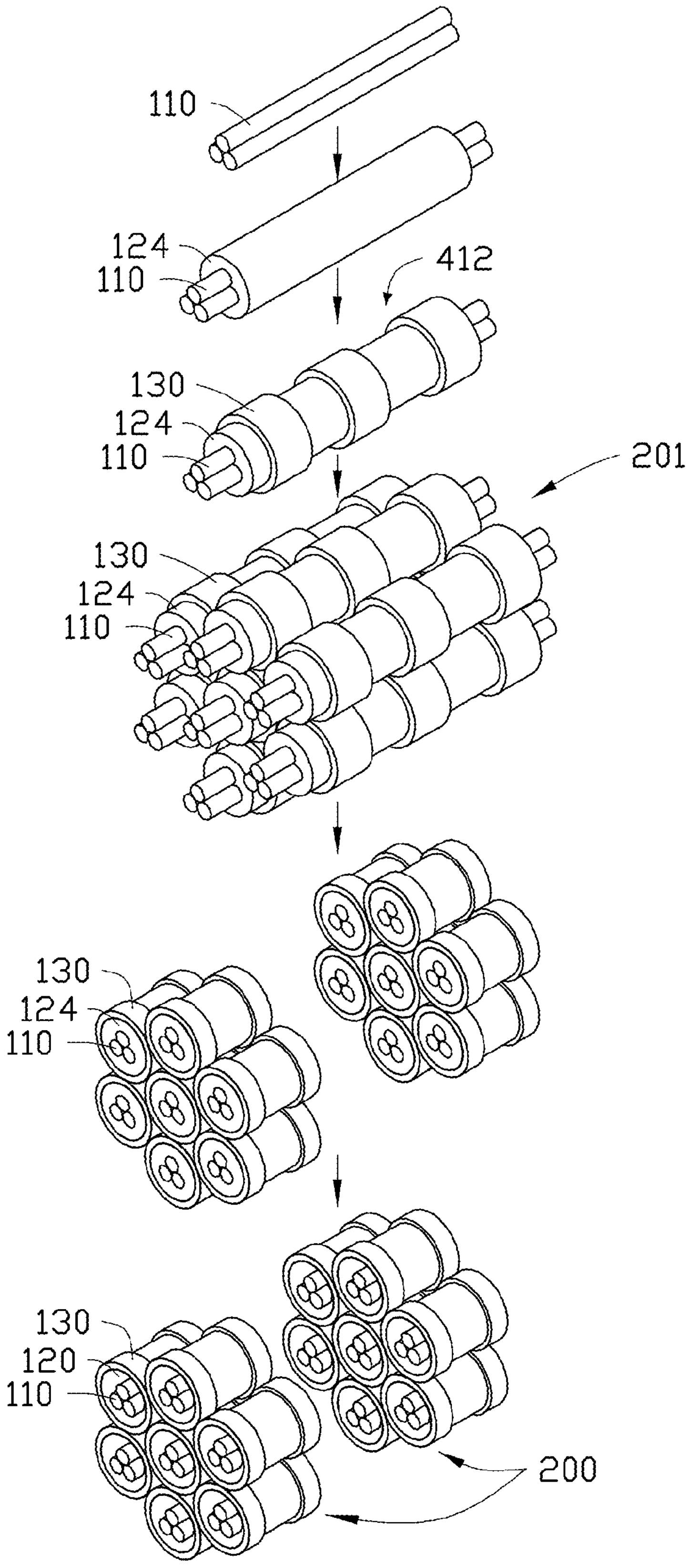
FIG. 12 is flowchart of one embodiment of a method for making field emission electron source array.

Referring to FIG. 12, one embodiment of a method of making a field emission electron source array 200 includes the following steps:

(S50) providing a linear carbon nanotube structure 110;

(S51) coating a layer of insulating material 124 on the outer surface of the linear carbon nanotube structure 110;

(S52) forming a field emission electron source preform 412 by locating a plurality of conductive rings 130 spaced from each other on the outer surface of the insulating material 124;

(S53) forming a field emission electron array preform 201 by aligning a plurality of field emission electron source preforms 412 side by side;

(S54) cutting the field emission electron array preform 201; and (S55) sintering the insulating material 124.

The method of making the field emission electron source array 200 is similar to the method of making the field emission electron source 20, except that a step of aligning the plurality of field emission electron source preforms 412 side by side is performed. Each field emission electron source array 200 includes a plurality of field emission electron sources 20 aligned side by side. After sintering, the insulating material 124 will be transferred into the insulating layer 120 formed in each of the field emission electron sources 20.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

What is claimed is:

1. A field emission electron source array, comprising:

a plurality of field emission electron sources aligned side by side, wherein each of the plurality of field emission electron sources comprises:

a linear carbon nanotube structure comprising a first end and a second end;

an insulating layer coated on an outer surface of the linear carbon nanotube structure; and a first conductive ring surrounding and attached on an outer surface of the insulating layer at the first end of the linear carbon nanotube structure;

wherein the first conductive rings of the plurality of field emission electron sources are electrically connected to each other.

2. The field emission electron source array of claim 1, wherein the linear carbon nanotube structures, in adjacent two of the field emission electron sources, are spaced by the plurality of conductive rings and the insulating layer.

3. The field emission electron source array of claim 1, wherein each of the plurality of the conductive rings comprises a first ring face, and the first ring face is coplanar with end surface of the first end of the linear carbon nanotube structure.

4. The field emission electron source array of claim 3, wherein the end surface of the first end of the linear carbon nanotube structure is exposed from the insulating layer.

5. The field emission electron source array of claim 1, wherein the linear carbon nanotube structure is a free standing structure.

6. The field emission electron source array of claim 1, wherein the linear carbon nanotube structure consists of a plurality of carbon nanotubes.

7. The field emission electron source array of claim 1, wherein each of the plurality of field emission electron sources further comprises a second conductive ring coated on the outer surface of the insulating layer and located on the second end of each field emission electron source, and the second conductive ring is spaced from the first conductive ring.

8. The field emission electron source array of claim 7, wherein each of the plurality of field emission electron sources further comprises an insulating ring coined on the outer surface of the insulating layer and between the first conductive ring and the second conductive ring.

9. The field emission electron source array of claim 1, wherein an end surface of the first end of the linear carbon nanotube structure, an insulating layer end surface, and a conductive ring face are coplanar.

10. The field emission electron source array of claim 1, wherein a recess is defined in an end surface of the insulating layer adjacent to the first end of the linear carbon nanotube structure, and the first end of the linear carbon nanotube structure extend out of the insulating layer.

11. The field emission electron source array of claim 1, further comprising a conductive layer electrically connected to a plurality of first conductive rings.

12. A field emission device, comprising:

a cathode electrode; and a field emission electron source array, wherein the field emission electron source array comprises a plurality of field emission electron sources aligned side by side, each field emission electron source comprises a first end electrically connected to the cathode electrode, and a second end extending away from the cathode electrode;

wherein each field emission electron source comprises a linear carbon nanotube structure, an insulating layer coated on an outer surface of the linear carbon nanotube structure, and a first conductive ring coated on an outer surface of the insulating layer on the second end of the field emission electron source, the first conductive ring on adjacent two field emission electron sources are electrically connected and configured as gate electrode of the field emission device.

13. The field emission device of claim 12, wherein the first conductive ring is around the outer surface of the insulating layer.

14. The field emission device of claim 12, wherein a first end of the linear carbon nanotube structure is electrically connected to the cathode electrode, and a second end of the linear carbon nanotube structure extends away from the cathode electrode.

15. The field emission device of claim 14, further comprising a second conductive ring spaced and insulated from the first conductive ring, and electrically connected to the cathode electrode.

16. The field emission device of claim 15, further comprising an insulating ring coated on the outer surface of the insulating layer exposed between the first conductive ring and the second conductive ring.

17. The field emission device of claim 14, wherein an end surface of the second end of the linear carbon nanotube structure is coplanar with end surface of the insulating layer and a ring face of the first conductive ring on the second end of the field emission electron source.

18. The field emission device of claim 12, further comprising a recess defined at two opposite ends of the insulating layer, and a first end of the linear carbon nanotube structure and a second end of the linear carbon nanotube structure extend out of the recess.

19. The field emission device of claim 18, wherein the second end of the linear carbon nanotube structure is exposed out of the insulating layer to emit electrons.

20. A field emission electron source array, comprising:

a plurality of field emission electron sources aligned side by side, wherein each of the plurality of field emission electron sources comprises:

a carbon nanotube structure, the carbon nanotube structure being linear shaped defining a first end and a second end, wherein the carbon nanotube structure comprises a plurality of carbon nanotube wires, and each of the plurality of carbon nanotube wires comprises a plurality of carbon nanotubes joined end to end by van der Waals attractive force;

an insulating layer coated on an outer surface of the plurality of carbon nanotube wires; and a first conductive ring located at the first end of the carbon nanotube structure and coated on a portion of an outer surface of the insulating layer;

a second conductive ring located at the second end of the carbon nanotube structure and coated on another portion of the outer surface of the insulating layer, and the second conductive ring is spaced from the first conductive ring;

wherein the first conductive rings of the plurality of field emission electron sources are electrically connected to each other.

* * * * *